United States Patent
Lee et al.

(10) Patent No.: US 7,928,819 B2
(45) Date of Patent: Apr. 19, 2011

(54) MULTILAYER LC COMPOSITE COMPONENT

(75) Inventors: Dong Hwan Lee, Gyunggi-Do (KR); Hee Soo Yoon, Gunggi-Do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 206 days.

(21) Appl. No.: 12/211,331

(22) Filed: Sep. 16, 2008

(65) Prior Publication Data

US 2009/0224849 A1    Sep. 10, 2009

(30) Foreign Application Priority Data

Mar. 4, 2008 (KR) .......................... 10-2008-0020015

(51) Int. Cl.
*H03H 7/01*    (2006.01)
*H01P 1/203*    (2006.01)
(52) U.S. Cl. .................. 333/185; 333/202; 333/204
(58) Field of Classification Search .................. 333/167, 333/185, 202, 204, 205
See application file for complete search history.

(56) References Cited

U.S. PATENT DOCUMENTS 6,538,531 B2 * 3/2003 Nosaka et al. ................ 333/174
7,262,675 B2    8/2007 Lee et al.

FOREIGN PATENT DOCUMENTS

| KR | 1020000059649 A | 10/2000 |
| KR | 1020040095822 A | 11/2004 |
| KR | 100550878 B1 | 2/2006 |
| KR | 100616674 B1 | 8/2006 |

OTHER PUBLICATIONS

KR Office Action for 10-2008-0020015 dated Jan. 9, 2010.

* cited by examiner

*Primary Examiner* — Robert Pascal
*Assistant Examiner* — Kimberly E Glenn
(74) *Attorney, Agent, or Firm* — Lowe, Hauptman, Ham & Berner, LLP

(57) ABSTRACT

There is provided a band pass filter including: a stacked body having a stacked structure of a plurality of dielectric sheets; and a plurality of elements provided in the stacked body, the plurality of elements including: a first capacitor electrode; a second capacitor electrode partially overlapping the first capacitor electrode to form capacitive coupling; a third capacitor electrode connected to the second capacitor electrode; a first inductor pattern having one end connected to the first capacitor electrode and the other end connected to a ground; a second inductor pattern having one end connected to the third capacitor electrode and the other end connected to the ground; an input terminal provided at one region of the first inductor pattern; and an output terminal provided at one region of the second inductor pattern.

5 Claims, 4 Drawing Sheets

MULTILAYER LC COMPOSITE COMPONENT

CROSS-REFERENCE TO RELATED APPLICATIONS

This application claims the priority of Korean Patent Application No. 2008-0020015 filed on Mar. 4, 2008, in the Korean Intellectual Property Office, the disclosure of which is incorporated herein by reference.

BACKGROUND OF THE INVENTION

1. Field of the Invention

The present invention relates to band pass filters, and more particularly, to a band pass filter provided in a PCB or an LTCC board that can be reduced in size by changing an internal structure of a modularized band pass filter and determine whether an error occurs before elements, such as an RFIC, an MMIC, and an SMD, are mounted to manufacture a module.

2. Description of the Related Art

The widespread of wireless mobile communication results in the use of high-band frequencies. There has been correspondingly an increasing demand for band pass filters that can be used in a high frequency band. Research has been made to implement various kinds of wireless mobile communication terminals and band pass filters, which can be used in a frequency range of several GHz where Bluetooth or wireless LAN operates, in the form of distributed elements.

The reduction in size of mobile communication devices inevitably involves a reduction in size of components mounted in the mobile communication devices. Therefore, various researches have been made for the reduction in size of the components.

Further, if an error occurs in one internal component after all of the components are mounted within a substrate, the entire substrate provided with the components needs to be abandoned, which may cause unnecessary costs. Therefore, there is a need for a structure that tests whether an internal element is defective to avoid unnecessary costs in the manufacturing process.

SUMMARY OF THE INVENTION

An aspect of the present invention provides a band pass filter that can be reduced in size and is provided in a PCB or an LTCC board to determine whether a pattern is defective.

According to an aspect of the present invention, there is provided a band pass filter including: a stacked body having a stacked structure of a plurality of dielectric sheets; and a plurality of elements provided in the stacked body, the plurality of elements including: a first capacitor electrode; a second capacitor electrode partially overlapping the first capacitor electrode to form capacitive coupling; a third capacitor electrode connected to the second capacitor electrode; a first inductor pattern having one end connected to the first capacitor electrode and the other end connected to a ground; a second inductor pattern having one end connected to the third capacitor electrode and the other end connected to the ground; an input terminal provided at one region of the first inductor pattern; and an output terminal provided at one region of the second inductor pattern.

The band pass filter may further include a conductive via connecting the second capacitor electrode and the third capacitor electrode, wherein the second capacitor electrode and the third capacitor electrode are provided on different dielectric sheet layers.

The first and third capacitor electrodes may be provided on the same dielectric sheet layer.

The band pass filter may further include a test electrode provided at the surface of the stacked body and connected to the second capacitor electrode.

The band pass filter may further include a stub having one end connected to the test electrode and the other end opened.

The stub may have an electrical length of λ/4 in a desired stopband.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
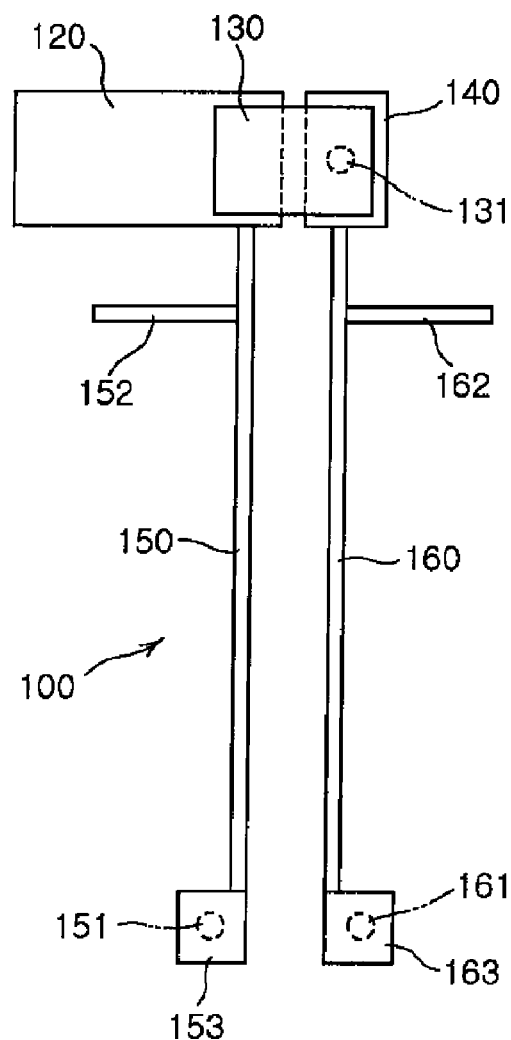
FIG. 1A is a configuration view illustrating a band pass filter according to an exemplary embodiment of the present invention.
Figure 1B:
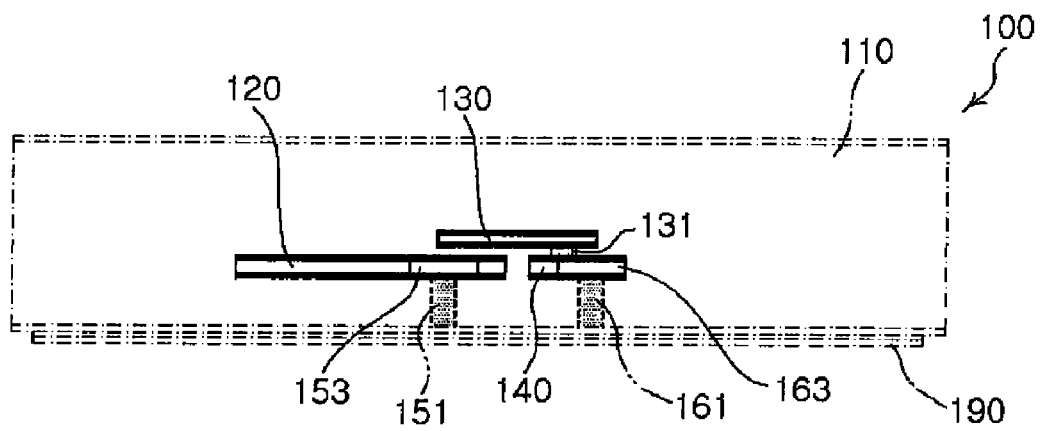
FIG. 1B is a cross-sectional view illustrating the band pass filter according to the exemplary embodiment of the present invention.
Figure 1C:
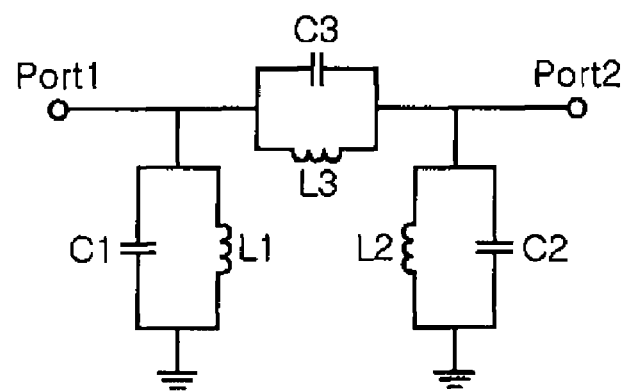
FIG. 1C is an equivalent circuit diagram illustrating the band pass filter according to the exemplary embodiment of the present invention.

FIG. 1A is a plan view illustrating a band pass filter according to an exemplary embodiment of the invention. FIG. 1B is a cross-sectional view illustrating the band pass filter according to the exemplary embodiment of the invention. FIG. 1C is an equivalent circuit diagram illustrating the band pass filter according to the exemplary embodiment of the invention.

Referring to FIGS. 1A and 1B, a band pass filter 100 according to this embodiment may include a first capacitor electrode 120, a second capacitor electrode 130, a third capacitor electrode 140, a first inductor pattern 150, a second inductor pattern 160, and a stacked body 110.

A plurality of dielectric sheets may be stacked to form the stacked body 110. Capacitor electrodes and inductor patterns may be formed on dielectric sheet layers between the stacked dielectric sheets of the stacked body. The dielectric sheet may be a ceramic sheet having a predetermined dielectric constant or an organic sheet like a printed circuit board.

The stacked body 110 may be manufactured by an LTCC (Low Temperature Co-fired Ceramic) process or a printed circuit board manufacturing process. In this embodiment, the capacitor electrodes and the inductor patterns may be implemented as distributed elements on the dielectric sheets. A ground 190 may be formed at one surface of the stacked body. Therefore, the distributed elements are implemented on the individual dielectric sheets, and the dielectric sheets are then stacked and fired, such that the band pass filter according to this embodiment can be implemented.

The first capacitor electrode 120 may have a predetermined area and be formed on one dielectric sheet layer of the dielectric sheet layers between the stacked dielectric sheets.

The second capacitor electrode 130 partially overlaps the first capacitor electrode 120 to form capacitive coupling. To this end, the second capacitor electrode 130 may be formed on a dielectric sheet layer different from the dielectric sheet layer on which the first capacitor electrode 120 is formed.

The third capacitor electrode 140 may be connected to the second capacitor electrode 130. In this embodiment, the second capacitor electrode 130 and the third capacitor electrode 140 may be formed on the different dielectric sheets, and may be connected to each other by a conductive via 131. The third capacitor electrode 140 may be formed on the same dielectric sheet on which the first capacitor electrode 120 is formed.

In this embodiment, the second capacitor electrode 130 and the third capacitor electrode 140 are formed on the different dielectric sheets, and are connected to each other by the conductive via 131. As a result, an area of the band pass filter where the capacitor electrodes are formed can be reduced to thereby reduce the size of the band pass filter.

The first inductor pattern 150 has one end that may be connected to the first capacitor electrode 120 and the other end that may be connected to the ground 190.

An input terminal 152 may be formed at one region of the first inductor pattern 150. The input terminal 152 may be exposed to the outside of the stacked body and connected to an input signal line.

The other end of the first inductor pattern 150 may be connected to the ground 190 that is formed outside the stacked body 110 by a conductive via 151.

The second inductor pattern 160 has one end that may be connected to the third capacitor electrode 140 and the other end that may be connected to the ground 190.

An output terminal 162 may be formed at one region of the second inductor pattern 160. The output terminal 162 may be exposed to the outside of the stacked body and be connected to an output signal line.

The other end of the second inductor pattern may be connected to the ground 190 that is formed outside the stacked body 110 by the conductive via 161.

FIG. 1C is an equivalent circuit diagram illustrating the band pass filter shown in FIGS. 1A and 1B.

In FIG. 1C, a port 1 and a port 2 correspond to the input terminal 152 and the output terminal 162, respectively, as shown in FIG. 1A. In FIG. 1C, $L_1$ may include inductance by the first inductor pattern 150, a via electrode 153, and the conductive via 151 as shown in FIG. 1A, and $C_1$ may include capacitance by the capacitive coupling between the first capacitor electrode 120 and the ground 190.

In the same manner, $L_2$ may include inductance by the second inductor pattern 160, a via electrode 163, and the conductive via 161, shown in FIG. 1A, and $C_2$ may include capacitance by capacitive coupling between the second and third capacitor electrodes 130 and 140 and the ground 190.

$L_3$ may include mutual inductance of the coupled first and second inductor patterns 150 and 160 facing each other and mutual inductance of the coupled first and third capacitor electrodes 120 and 140 facing each other. $C_3$ may include capacitance of capacitive coupling between the first capacitor electrode 120 and the second capacitor electrode 130 and capacitance of capacitive coupling between the inductor patterns facing each other and the capacitor electrodes facing each other.

Inductance values of $L_1$, $L_2$, and $L_3$ may vary according to positions of the input terminal 152 and the output terminal 162 that are formed on the regions of the inductor patterns 150 and 160, respectively.

Figure 2A:
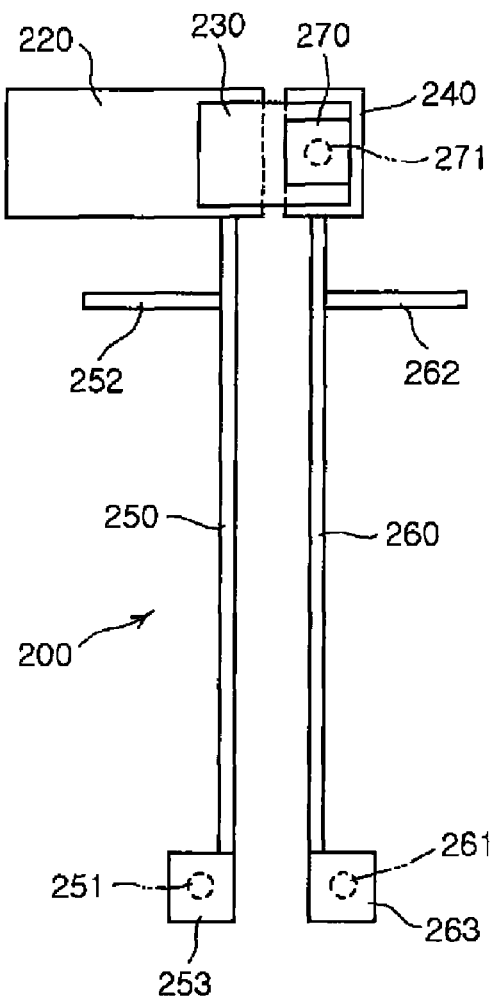
FIG. 2A is a configuration view illustrating a band pass filter according to another exemplary embodiment of the present invention.
Figure 2B:
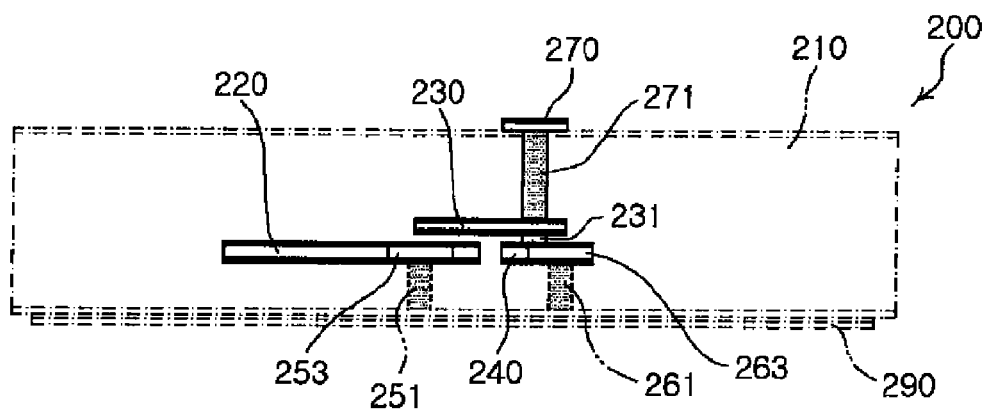
FIG. 2B is a cross-sectional view illustrating the band pass filter according to the exemplary embodiment of the present invention.

FIG. 2A is a plan view illustrating a band pass filter according to another exemplary embodiment of the present invention. FIG. 2B is a cross-sectional view illustrating the band pass filter according to the exemplary embodiment of the present invention.

Referring to FIGS. 2A and 2B, a band pass filter 200 according to this embodiment may include a first capacitor electrode 220, a second capacitor electrode 230, a third capacitor electrode 240, a first inductor pattern 250, a second inductor pattern 260, a stacked body 210, and a test electrode 270.

A plurality of dielectric sheets may be stacked to form the stacked body 210. Capacitor electrodes and inductor patterns may be formed on dielectric sheet layers of the dielectric sheets between the stacked body. The dielectric sheet may be a ceramic sheet having a predetermined dielectric constant and an organic sheet such as a printed circuit board.

The stacked body 210 may be manufactured by an LTCC (Low Temperature Co-fired Ceramic) process or a printed circuit board manufacturing process.

In this embodiment, the capacitor electrodes and the inductor patterns may be implemented as distributed elements on the dielectric sheets. A ground 290 may be formed on one surface of the stacked body. Therefore, the distributed elements are implemented on the individual dielectric sheets and then the dielectric sheets are stacked and fired to thereby implement the pass band filter.

The first capacitor electrode 220 may have a predetermined area and be formed on one of the stacked dielectric sheets.

The second capacitor electrode 230 may partially overlap the first capacitor electrode 220 to form capacitive coupling. To this end, the second capacitor electrode 230 may be formed on a dielectric sheet different from the dielectric sheet on which the first capacitor electrode 220 is formed.

The third capacitor electrode 240 may be connected to the second capacitor electrode 230. In this embodiment, the second capacitor electrode 230 and the third capacitor electrode 240 may be formed on the different dielectric sheets by a conductive via 231. The third capacitor electrode 240 may be formed on the same dielectric sheet on which the first capacitor electrode 220 is formed.

In this embodiment, the second capacitor electrode 230 and the third capacitor electrode 240 are formed on the different dielectric sheets, and connected to each other by the conductive via 231. Accordingly, an area of the band pass filter where the capacitor electrodes are formed can be reduced to thereby cause a reduction in size of the band pass filter.

The first inductor pattern 250 has one end that may be connected to the first capacitor electrode 220 and the other end that may be connected to the ground 290.

An input terminal 252 may be formed at one region of the first inductor pattern 250, and the input terminal 252 may be exposed to the outside of the stacked body and connected to an input signal line.

The other end of the first inductor pattern may be connected to the ground 290 that is formed outside the stacked body 210 by a conductive via 251.

The second inductor pattern 260 has one end that may be connected to the third capacitor electrode 240 and the other end that may be connected to the ground 290.

An output terminal 262 may be formed at one region of the second inductor pattern 260. The output terminal 262 may be exposed to the outside of the stacked body and connected to an output signal line.

The other end of the second inductor pattern may be connected to the ground 290 formed outside the stacked body 210 by a conductive via 261.

The test electrode 270 may be formed on the surface of the stacked body 210 and connected to the second capacitor electrode 230 by a conductive via 271.

The test electrode 270 is used to determine whether an error occurs in the modularized band pass filter 200.

When a band pass filter does not have the test electrode, in order to determine whether an error occurs in the band pass filter, the band pass filter and other elements are mounted onto the actual substrate, and then entire characteristics thereof are measured. In this case, when the band pass filter is defective, the substrate itself provided with the other elements needs to be abandoned, which may cause significant economic loss.

However, it is possible to determine whether an error occurs or not by using the band pass filter according to this embodiment since the band pass filter has the test electrode 270. Therefore, unnecessary costs that may arise in the process of mounting the band pass filter onto the substrate can be avoided.

That is, it can be determined whether an error occurs in the band pass filter by detecting an open or short circuit between the input terminal 252 and the test electrode 270 and an open or short circuit between the output terminal 262 and the test electrode 270.

When open and short circuit characteristics between the output terminal 262 and the test electrode 270 are measured, open and short circuit characteristics of the conductive via 231 connecting the second capacitor electrode and the third capacitor electrode can be measured.

The input terminal 252 is connected to the first inductor pattern 250, the other end of the first inductor pattern 250 is connected to the ground 290 outside of the stacked body through the via hole 251, and the ground 290 is connected to the other end of the second inductor pattern by the conductive via 261. For this reason, when open and short circuit characteristics between the input terminal 252 and the test electrode 270 are measured, open and short circuit characteristics of the conductive via 251 connected to the first inductor pattern, the conductive via 261 connected to the second inductor pattern, and the conductive via 231 between the second capacitor electrode and the third capacitor electrode can be measured. If a direct current DC is applied, the band pass filter can operate normally when a short-circuit occurs between the input terminal 252 and the test electrode 270 and a short-circuit occurs between the output terminal 262 and the test electrode 270.

Here, it may be determined whether an error occurs in the band pass filter by using a multimeter that measures open and short circuit characteristics with the direct current DC being applied.

In this embodiment, it is possible to determine whether an error occurs in the band pass filter by simply measuring open and short circuit characteristics. Therefore, unnecessary costs that may arise in the manufacturing process can be avoided.

Figure 3A:
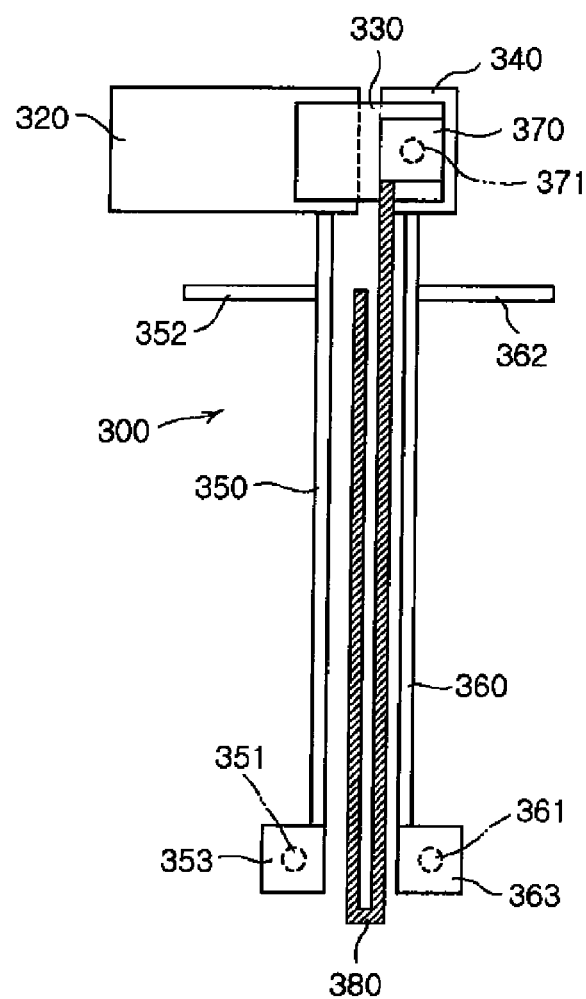
FIG. 3A is a configuration view illustrating a band pass filter according to still another exemplary embodiment of the present invention.

FIG. 3A is a plan view illustrating a band pass filter according to still another exemplary embodiment of the invention.

Figure 3B:
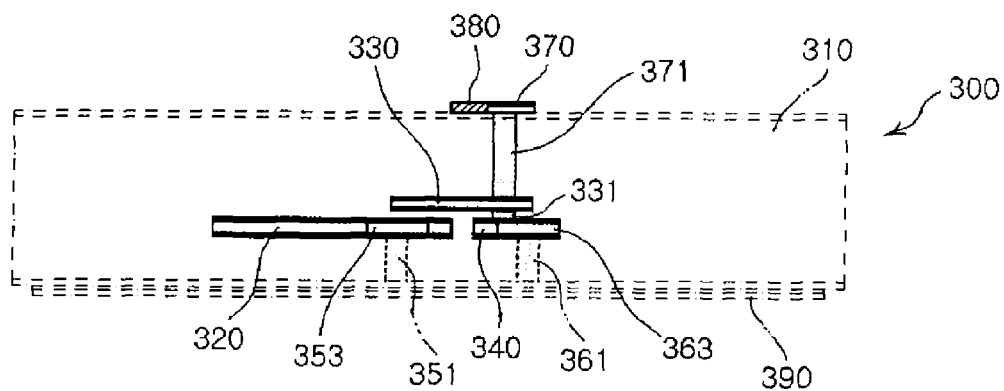
FIG. 3B is a cross-sectional view illustrating the band pass filter according to the exemplary embodiment of the present invention.

FIG. 3B is a cross-sectional view illustrating the band pass filter according to the exemplary embodiment of the invention.

Referring to FIGS. 3A and 3B, a band pass filter 300 according to this embodiment may include a first capacitor electrode 320, a second capacitor electrode 330, a third capacitor electrode 340, a first inductor pattern 350, a second inductor pattern 360, a stacked body 310, a test electrode 370, and an open stub 380.

A plurality of dielectric sheets may be stacked to form the stacked body 310. Capacitor electrodes and inductor patterns may be formed on different dielectric sheet layers of the dielectric sheets between the stacked body. The dielectric sheet may be a ceramic sheet having a predetermined dielectric constant or an organic sheet such as a printed circuit board.

The stacked body 310 may be manufactured by an LTCC (Low Temperature Co-fired Ceramic) process or a printed circuit board manufacturing process. In this embodiment, the capacitor electrodes and the inductor patterns may be implemented as distributed elements on the dielectric sheets. A ground 390 may be formed at one surface of the stacked body. Therefore, the distributed elements may be realized on the individual dielectric sheets, and then the dielectric sheets are stacked and fired to implement the band pass filter according to this embodiment.

The first capacitor electrode 320 may have a predetermined area and be formed on one of the stacked dielectric sheet.

The second capacitor electrode 330 may partially overlap the first capacitor electrode 320 to form capacitive coupling. To this end, the second capacitor electrode 330 may be formed on a dielectric sheet different from the dielectric sheet on which the first capacitor electrode 320 is formed.

The third capacitor electrode 340 may be connected to the second capacitor electrode 330. In this embodiment, the second capacitor electrode 330 and the third capacitor electrode 340 may be formed on the different dielectric sheets and connected to each other by a conductive via 331. The third capacitor electrode 340 may be formed on the same dielectric sheet on which the first capacitor electrode 320 is formed.

According to this embodiment, the second capacitor electrode 330 and the third capacitor electrode 340 may be formed on the different dielectric sheets, and connected to each other by the conductive via 331, such that an area of the band pass filter where the capacitor electrodes are formed can be reduced to thereby reduce the size of the band pass filter.

The first inductor pattern 350 has one end that may be connected to the first capacitor electrode 320 and the other end that may be connected to the ground 390.

An input terminal 352 may be formed at one region of the first inductor pattern 350. The input terminal 352 may be exposed to the outside of the stacked body and connected to an input signal line.

The other end of the first inductor pattern 250 may be connected to the ground 390 that is formed outside of the stacked body 310 of the conductive via 351.

The second inductor pattern 360 has one end that may be connected to the third capacitor electrode 340 and the other end that may be connected to the ground 390.

An output terminal 362 may be formed at one region of the second inductor pattern 360. The output terminal 362 may be exposed to the outside of the stacked body and connected to an output signal line.

The other one end of the second inductor pattern may be connected to the ground 390 that is formed outside the stacked body 310 by a conductive via 361.

The test electrode 370 may be formed on the surface of the stacked body 310 and connected to the second capacitor electrode 330 by a conductive via 371.

The test electrode 370 is used to determine whether an error occurs in the modularized band pass filter 300.

When a band pass filter does not have the test electrode, in order to determine whether an error occurs in the band pass filter, after the band pass filter and other elements are mounted onto the actual substrate, and then entire characteristics thereof are measured. In this case, when the band pass filter is defective, the entire substrate provided with elements need to be abandoned, which may cause economic loss.

In this embodiment, it is possible to determine whether an error occurs by using the band pass filter since the test electrode 370 is provided in the band pass filter. Therefore, unnecessary costs that may arise in the process of mounting the band pass filter onto the substrate can be avoided.

That is, it can be determined whether an error occurs in the band pass filter by detecting open and short circuits between the input terminal 352 and the test electrode 370 and open and short circuits between the output terminal 362 and the test electrode 370.

When open and short circuit characteristics between the output terminal 362 and the test electrode 370 are measured, open and short circuit characteristics of the conductive via 331 connecting the second capacitor electrode and the third capacitor electrode can be measured.

The input terminal 352 is connected to the first inductor pattern 350, the other end of the first inductor pattern 350 is connected to the ground 390 outside of the stacked body through the via hole 351, and the ground 390 is connected to the other end of the second inductor pattern by the conductive via 361. For this reason, when open and short circuit characteristics between the input terminal 352 and the test electrode 370 are measured, open and short circuit characteristics of the conductive via 351 connected to the first inductor pattern, the conductive via 361 connected to the second inductor pattern, and the conductive via 331 between the second capacitor electrode and the third capacitor electrode can be measured. If a direct current DC is applied, the band pass filter can operate normally when a short-circuit occurs between the input terminal 352 and the test electrode 370 and a short-circuit occurs between the output terminal 362 and the test electrode 370.

Here, it may be determined whether an error occurs in the band pass filter by using a multimeter that measures open and short circuit characteristics with the direct current DC being applied.

In this embodiment, it is possible to determine whether an error occurs in the band pass filter by simply measuring open and short circuit characteristics. Therefore, unnecessary costs that may arise in the manufacturing process can be avoided.

The open stub 380 may have one end that is connected to the test electrode 370 and the other end that is opened.

The open stub 380 may have an electrical length of λ/4 with respect to a desired stopband frequency. The open stub 380 is provided to additionally form an attenuation pole to characteristics of the band pass filter.

That is, when the one end of the stub is opened, impedance is increased, and thus an input frequency signal may not flow through the stub. However, if the stub has an electrical length of λ/4 with respect to a predetermined frequency, since the stub operates under short-circuited conditions at the frequency, the impedance may be reduced at the frequency. Therefore, the predetermined frequency signal flows through the stub but does not flow through the filter.

As described above, the open stub having the electrical length of λ/4 with respect to the predetermined frequency is formed to thereby increase band rejection characteristics of the filter with respect to the frequency band signal.

In this embodiment, the open stub 380 may not overlap another element inside the stacked body in order to reduce electromagnetic coupling between the open stub 380 and another element formed inside the stacked body due to the open stub 380.

Figure 4:
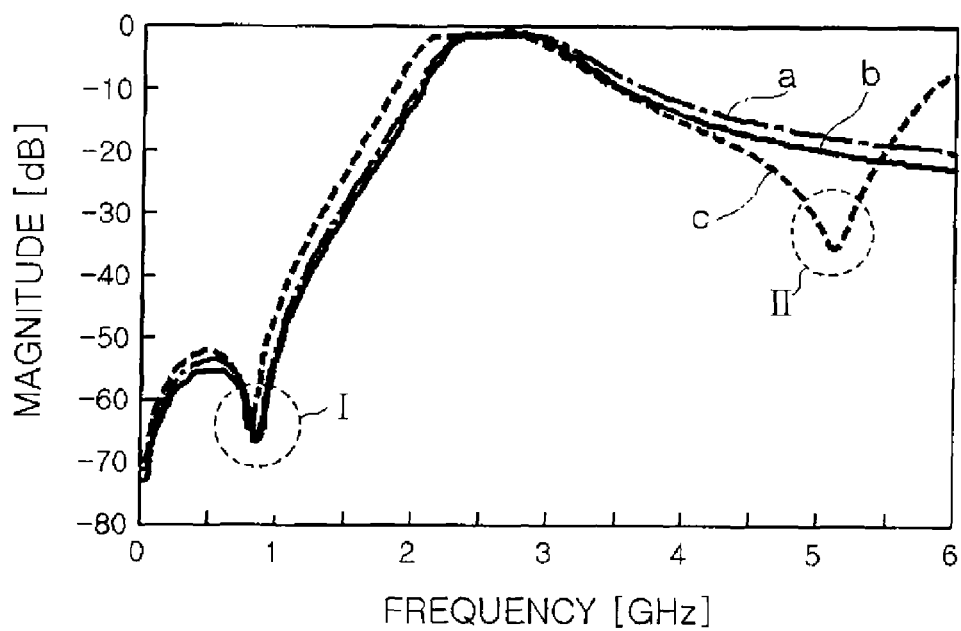
FIG. 4 is a graph illustrating bandpass characteristics of the band pass filters according to the embodiments of FIGS. 1A to 1C, FIGS. 2A and 2B, and FIGS. 3A to 3C.

FIG. 4 is a graph illustrating bandpass characteristics of the band pass filters according to the embodiments of FIGS. 1 to 3. Common elements of the band pass filters according to the embodiments of the invention have the same physical size. The filters have band pass characteristics within a range of 2.5 GHz±100 MHz.

Referring to FIG. 4, a bandpass characteristic (a) of the band pass filter according to the embodiment, shown in FIG. 1, a bandpass characteristic (b) of the band pass filter according to the embodiment, shown in FIG. 2, and a bandpass characteristic (c) of the band pass filter according to the embodiment, shown in FIG. 3, are shown.

The band pass filters according to the embodiments, shown in FIGS. 1 and 2, have good bandpass characteristic with respect to a frequency signal within the frequency range of approximately 2.4 to 2.6 GHz. Further, the bandpass characteristics (a and b) in the embodiments, shown in FIGS. 1 and 2, almost coincide with each other. Therefore, it cannot be considered that the added test electrode in the embodiment, shown in FIG. 2, affects the band pass filter much.

In the bandpass characteristic (c) of the band pass filter according to the embodiment, shown in FIG. 3, the band pass filter has good bandpass characteristic within the frequency range of approximately 2.4 to 2.6 GHz like the embodiments, shown in FIGS. 1 and 2, and one attenuation pole II occurs at approximately 5.2 GHz. In this way, attenuation characteristics at the predetermined frequency band are increased to enhance the stopband characteristics of the band pass filter, such that efficiency of the filter can be increased. In this embodiment, the open stub has the electrical length of λ/4 with respect to the stopband frequency signal to form the attenuation pole. The position of the attenuation pole can be controlled by changing the electrical length of the stub.

As set forth above, according to the exemplary embodiments of the invention, an internal band pass filter that can be easily reduced in size and perform a self-test to determine whether an error occurs before components are mounted to manufacture a finished product, such as a module.

While the present invention has been shown and described in connection with the exemplary embodiments, it will be apparent to those skilled in the art that modifications and variations can be made without departing from the spirit and scope of the invention as defined by the appended claims.

What is claimed is:
1. A multilayer LC component comprising:
   a stacked body having a stacked structure of a plurality of dielectric sheets; and
   a plurality of elements provided in the stacked body, the plurality of elements comprising:
   a first capacitor electrode;
   a second capacitor electrode partially overlapping the first capacitor electrode to form capacitive coupling;
   a third capacitor electrode connected to the second capacitor electrode;
   a first inductor pattern having one end connected to the first capacitor electrode and other end connected to a ground;
   a second inductor pattern having one end connected to the third capacitor electrode and other end connected to the ground;

an input terminal provided at one region of the first inductor pattern;

an output terminal provided at one region of the second inductor pattern; and a conductive via connecting the second capacitor electrode and the third capacitor electrode, wherein the second capacitor electrode and the third capacitor electrode are provided on different sheet layers of the plurality of dielectric sheets.

2. The multilayer LC component of claim 1, wherein the first and third capacitor electrodes are provided on a same dielectric sheet layer of one the plurality of dielectric sheets.

3. The multilayer LC component of claim 1, further comprising a test electrode provided at a surface of the stacked body and connected to the second capacitor electrode.

4. The multilayer LC component of claim 3, further comprising a stub having one end connected to the test electrode and another end opened.

5. The multilayer LC component of claim 4, wherein the stub has an electrical length of $\lambda/4$ in a desired stopband.

* * * * *